(12) United States Patent
Li et al.

(10) Patent No.: US 11,594,541 B2
(45) Date of Patent: Feb. 28, 2023

(54) ONE-TIME PROGRAMMABLE MEMORY ARRAY AND MANUFACTURING METHOD THEREOF

(71) Applicant: NANYA TECHNOLOGY CORPORATION, New Taipei (TW)

(72) Inventors: Wei-Zhong Li, Taoyuan (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 152 days.

(21) Appl. No.: 17/214,494

(22) Filed: Mar. 26, 2021

(65) Prior Publication Data
US 2022/0310633 A1 Sep. 29, 2022

(51) Int. Cl.
*H01L 27/112* (2006.01)

(52) U.S. Cl.
CPC .............................. *H01L 27/11206* (2013.01)

(58) Field of Classification Search
CPC .................................................. H01L 27/11206
See application file for complete search history.

(56) References Cited

U.S. PATENT DOCUMENTS 9,589,971 B1 * 3/2017 Chang ................ H01L 27/11293
9,613,714 B1 * 4/2017 Wong .................. G06F 12/1408
9,799,662 B2 * 10/2017 Wong .................... H01L 23/528
2010/0061137 A1 3/2010 Kim
2020/0058660 A1 2/2020 Chang et al.

FOREIGN PATENT DOCUMENTS

TW 201727837 A 8/2017
TW 201806132 A 2/2018

* cited by examiner

*Primary Examiner* — Allison Bernstein
(74) *Attorney, Agent, or Firm* — Muncy, Geissler, Olds & Lowe, P.C.

(57) ABSTRACT

The present application provides an anti-fuse one-time programmable (OTP) memory array and a manufacturing method of the anti-fuse one-time programmable (OTP) memory array. The memory array includes: active areas; pairs of programming word lines and read word lines; and dummy word lines. The active areas extend along a first direction in a semiconductor substrate, and are separately arranged along a second direction. The programming word lines, the read word lines and the dummy word lines extend along the second direction over the semiconductor substrate. A region in which a pair of programming word line and read word line are intersected with one of the active areas defines a unit cell in the memory array. The dummy word lines respectively lie between adjacent pairs of programming word lines and read word lines. A region in which one of the dummy word lines is intersected with one of the active areas defines an isolation transistor.

11 Claims, 20 Drawing Sheets

ONE-TIME PROGRAMMABLE MEMORY ARRAY AND MANUFACTURING METHOD THEREOF

TECHNICAL FIELD

The present disclosure relates to a memory device and a manufacturing method thereof, and more particularly, to a semiconductor device including a one-time programmable (OTP) memory array and a manufacturing method of the semiconductor device.

DISCUSSION OF THE BACKGROUND

Nonvolatile memory devices can retain data even when their power supply is cut off. According to programmable times, the nonvolatile memory devices can be further divided into multi-time-programmable (MTP) memory devices and one-time-programmable (OTP) memory devices. Users can program a MTP memory device multiple times to modify the data stored in the MTP memory device. On the other hand, an OTP memory device can be only programmed once, and data stored in the OTP memory device cannot be modified.

Further, the OTP memory device may be classified into a fuse type and an anti-fuse type according to a programmed state of the OTP memory device. The fuse type OTP memory device is short before being programmed, and open after being programmed. In contrast, the anti-fuse type OTP memory device is open before being programmed, and is short after being programmed. As compared to the fuse type OTP memory device, the anti-fuse type OTP memory device is more compatible with complementary metal-oxide-semiconductor CMOS) fabricating process.

Isolation between unit cells in an anti-fuse OTP memory array is important for blocking crosstalk between the unit cells. However, an insulating structure spreading between the unit cells for realizing such isolation may pose obstacles for down scaling the anti-fuse OTP memory array.

SUMMARY

In an aspect of the present disclosure, an anti-fuse OTP memory array is provided. The anti-fuse OTP memory array comprises: active areas, extending along a first direction in a semiconductor substrate, and separately arranged along a second direction; pairs of programming word lines and read word lines, extending along the second direction over the semiconductor substrate, wherein a region in which one of the pairs of programming word lines and read word lines are intersected with one of the active areas defines a unit cell in the anti-fuse OTP memory array; and dummy word lines, extending along the second direction over the semiconductor substrate, and respectively lying between adjacent pairs of programming word lines and read word lines, wherein a region in which one of the dummy word lines is intersected with one of the active areas defines an isolation transistor.

In another aspect of the present disclosure, an anti-fuse OTP memory array is provided. The anti-fuse OTP memory array comprises: unit cells, arranged along columns and rows, and each comprising an access transistor and an anti-fuse storage element electrically coupled to a source/drain terminal of the access transistor; and isolation transistors, each electrically coupled to adjacent ones of the unit cells in the same row, and configured to be kept in an off state, to electrically isolate the adjacent ones of the unit cells from each other.

In yet another aspect of the present disclosure, an anti-fuse OTP memory array is provided. The anti-fuse OTP memory array comprises: an active area, laterally extending in a semiconductor substrate; a first read word line and a first programming word line, extending over and intersected with the active area, and spaced apart from each other, wherein a first unit cell of the anti-fuse OTP memory array is defined in a region in which the first read word line and the first programming word line are intersected with the active area; a pair of first source/drain structures, disposed in the active area and within the first unit cell, wherein the first read word line is located between the pair of first source/drain structures, and the first programming word line overlaps one of the first source/drain structures; a second read word line and a second programming word line, extending over and intersected with the active area, and spaced apart from each other, wherein a second unit cell of the anti-fuse OTP memory array is defined in a region in which the second read word line and the second programming word line are intersected with the active area; a pair of second source/drain structures, disposed in the active area and within the second unit cell, wherein the second read word line is located between the pair of second source/drain structures, and the first programming word line overlaps one of the second source/drain structures; and a dummy word line, extending over the active area and in between the first and second unit cells, wherein an isolation transistor is defined in a region where the dummy word line is intersected with the active area.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
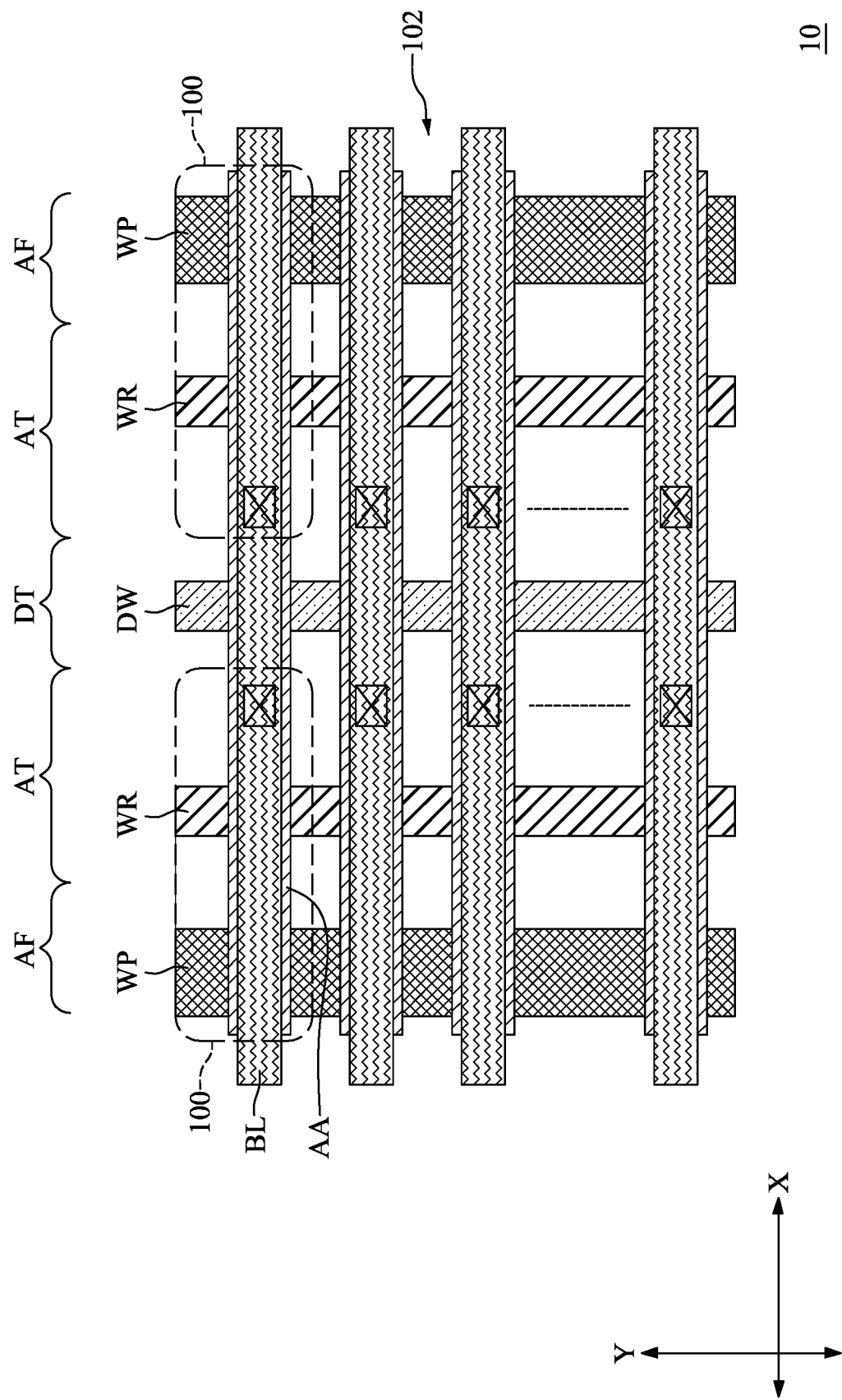
FIG. 1A is a layout diagram illustrating an anti-fuse OTP memory array, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be finned between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
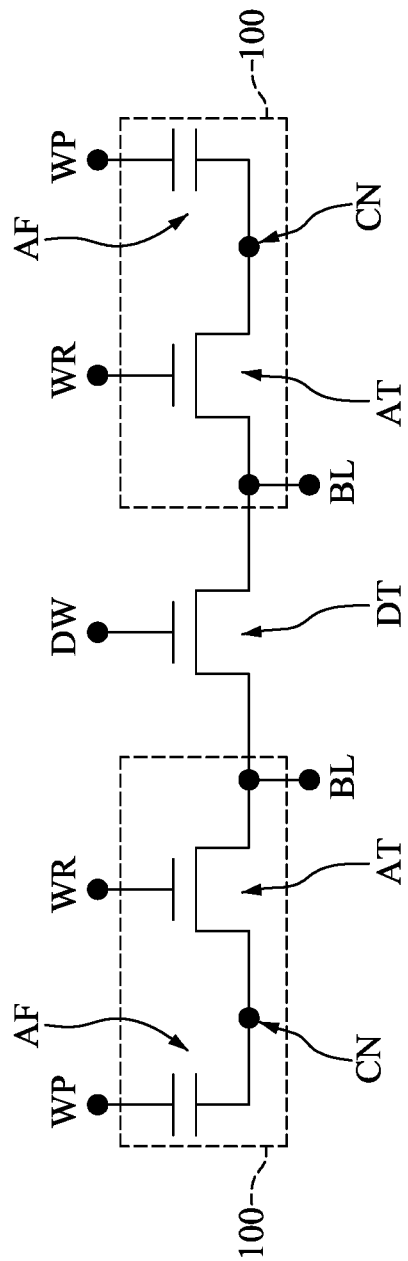
FIG. 1B is a circuit diagram illustrating adjacent unit cells in the anti-fuse OTP memory array shown in FIG. 1A.

FIG. 1A is a layout diagram illustrating an anti-fuse OTP memory array 10, according to some embodiments of the present disclosure. FIG. 1B is a circuit diagram illustrating adjacent unit cells 100 in the anti-fuse OTP memory array 10 shown in FIG. 1A.

Referring to FIG. 1A, the anti-fuse OTP memory array 10 includes a plurality of the unit cells 100 arranged along rows and columns. The unit cells 100 in the same row may be arranged along a direction X, while the unit cells 100 in the same column may be arranged along a direction Y intersected with the direction X. Each unit cell 100 may be coupled to a programming word line WP, a read word line WR and a bit line BL, and may be defined in a region where an active area AA is intersected with the programming word line WP and the read word line WR, As will be further described with reference to FIG. 1C, the active area AA may be a doped region in a semiconductor substrate, while the programming word line WP, the read word line WR and the bit line BL may be conductive lines over the semiconductor substrate. In some embodiments, the unit cells 100 in the same row may share the same active area AA and the same bit line BL, and the unit cells 100 in the same column may share one of the programming word lines WP and one of the read word lines WR. In these embodiments, the bit lines BL and the active areas AA may extend along the direction X, while the programming word lines WP and the read word lines WR may run along the direction Y.

Referring to FIG. 1A and FIG. 1B, each of the unit cells 100 includes an access transistor AT and an anti-fuse storage element AF coupled to the access transistor AT. In some embodiments, the access transistor AT is a three-terminal device, while the anti-fuse storage element AF is a two-terminal device. For instance, the access transistor AT may be a field effect transistor (e.g., an N-type field effect transistor), and the anti-fuse storage element AF may be a capacitor. One of the read word lines WR coupled to the unit cell 100 is functioned as a gate terminal of the access transistor AT in the unit cell 100. A source/drain terminal of the access transistor AT is coupled to one of the bit lines BL. The other source/drain terminal of the access transistor AT is coupled to a terminal of the anti-fuse storage element AF, and may be referred as a common node CN (shown in FIG. 1B). Further, one of the programming word lines WP is functioned as the other terminal of the anti-fuse storage element AF.

Accordingly, a voltage bias across the anti-fuse storage element AF is determined by a voltage supplied to the programming word line WP and a voltage at the common node CN. If a unit cell 100 is selected for programming, the access transistor AT of the selected unit cell 100 is turned on, and a voltage at the common node CN of the selected unit cell 100 is pulled to a voltage (e.g., a ground voltage) received by a hit line BL coupled to the selected unit cell 100. In addition, the programming word line WP coupled to the selected unit cell 100 may receive a programming voltage high enough that a difference between the programming voltage and the voltage at the selected bit line BL can result in a breakdown of the anti-fuse storage element AF, so as to program the anti-fuse storage element AF. Once the anti-fuse storage element AF is programmed, the two terminals of the anti-fuse storage element AF is shorted, and a resistance state of the anti-fuse storage element AF turns to a low resistance state from a high resistance state, Such resistance change is opposite to a resistance change of an electrical fuse, and it may be how the "anti-fuse" came from.

On the other hand, the anti-fuse storage element AF in an un-selected unit cell 100 may not be programmed during a programming operation. The access transistor AT in the un-selected unit cell 100 is kept in an off state, thus the source/drain terminal of this access transistor AT as the common node CN is electrically floated. As a result, a difference between a voltage supplied to the programming word line WP coupled to the un-selected unit cell 100 and a voltage at the common node CN may not be sufficient to break down the anti-fuse storage element AF in the un-selected unit cell 100. Therefore, the anti-fuse storage element AF in the un-selected unit cell 100 may remain in an open state (i.e., a high resistance state).

During a read operation, the access transistor AT in a selected unit cell 100 is turned on. In addition, the programming word line WP coupled to the selected unit cell 100 may receive a read voltage lower than the programming voltage used in a programming operation, and the bit line BL coupled to the selected unit cell 100 may be grounded. If the anti-fuse storage element AF in the selected unit cell 100 has been programmed (i.e., shorted), a difference between the read voltage supplied to the programming word line WP and the ground voltage at the bit line BL may result in a read current passing through the anti-fuse storage element AF. On the other hand, if the anti-fuse storage element AF is in an open state, there would be barely a current passing through the anti-fuse storage element AF, By sensing the presence of the read current on the bit line BL, a resistance state of the anti-fuse storage element AF (i.e., a bit data stored in the anti-fuse storage element AF) can be identified.

In some embodiments, each active area AA extends through a row of the unit cells 100, and is shared by these unit cells 100 in the same row. In order to block crosstalk between adjacent unit cells 100 through the shared active area AA, isolation transistors DT are respectively disposed between adjacent unit cells 100 arranged along the row direction (i.e., the direction X). The isolation transistors DT may be parasitic field effect transistors each formed by a dummy word line DW, an overlapped portion of an underlying active area AA, and source/drain terminals of the access transistors AT at opposite sides of the dummy word line DW and connected to the portion of the active area AA. As an example shown in FIG. 1A and FIG. 1B, the dummy word line DW, underlying portions of the active areas AA and the source/drain terminals of the access transistor AT at opposite sides of the dummy word line DW and coupled to the bit lines BL may form the isolation transistors DT. By controlling a voltage of the dummy word lines DW, the isolation transistors DT can be kept in an off state. As a result, current paths may not form in the portions of the active areas AA overlapped with the dummy word lines DW. In other words, crosstalk between adjacent unit cells 100 through these portions of the active areas AA can be blocked. For instance, the isolation transistors DT are N-type field effect transistors, and the dummy word lines DW are coupled to a negative voltage, such that the N-type isolation transistors DT can be ensured in an off state. Alternatively, the dummy word lines DW of the N-type isolation transistors DT may be grounded, and the N-type isolation transistors DT may also be kept in an off state.

In some embodiments, the access transistors AT and the anti-fuse storage elements AF adjacent unit cells 100 at opposite sides of a dummy word line DW are symmetrically arranged with respect to the dummy word line DW. As an example shown in FIG. 1A, the read word lines WR of the access transistors AT and the programming word lines WP of the anti-fuse storage elements AF are symmetrically arranged with respect to the dummy word line DW, and each of the read word lines WR extends between the dummy word line DW and one of the programming word lines WP. In these embodiments, although not shown, another dummy word line DW may extend between two programming word lines WP (e.g., the rightmost programming word line WP shown in FIG. 1A and an additional programming word line (not shown) at a right side of this programming word line WP) respectively located between this dummy word line DW and a read word WR. In this way, source and drain terminals of an access transistor AT may be respectively functioned as a source/drain terminal of one of the isolation transistors DT.

As compared to cutting each active area AA into separated segments by an isolation structure for blocking the crosstalk between adjacent unit cells 100, employing the isolation transistors DT for realizing isolation between adjacent unit cells 100 can reduce an overall footprint area or increase memory density of the anti-fuse OTP memory array 10, since the dummy word line DW can be formed with a width (e.g., 20 nm) much less than a width of the isolation structure between adjacent unit cells 100 (e.g., 50 nm). Furthermore, by avoiding using the isolation structure for blocking the crosstalk between adjacent unit cells 100 arranged along the row direction (i.e., the direction X), a possible stress effect (resulted during formation of the isolation structure) on the unit cells 100 can be effectively reduced.

On the other hand, according to embodiments of the present disclosure, the active areas AA arranged along the column direction (i.e., the direction Y) are isolated and separated from one another by an isolation structure 102 (the blank area in FIG. 1A). The isolation structure 102 may laterally surround the active areas AA, but may not extend in between adjacent unit cells 100 arranged along the row direction (i.e., the direction Y). As described above, the isolation between adjacent unit cells 100 arranged along the row direction (i.e., the direction X) is realized by the isolation transistors DT.

Figure 2:
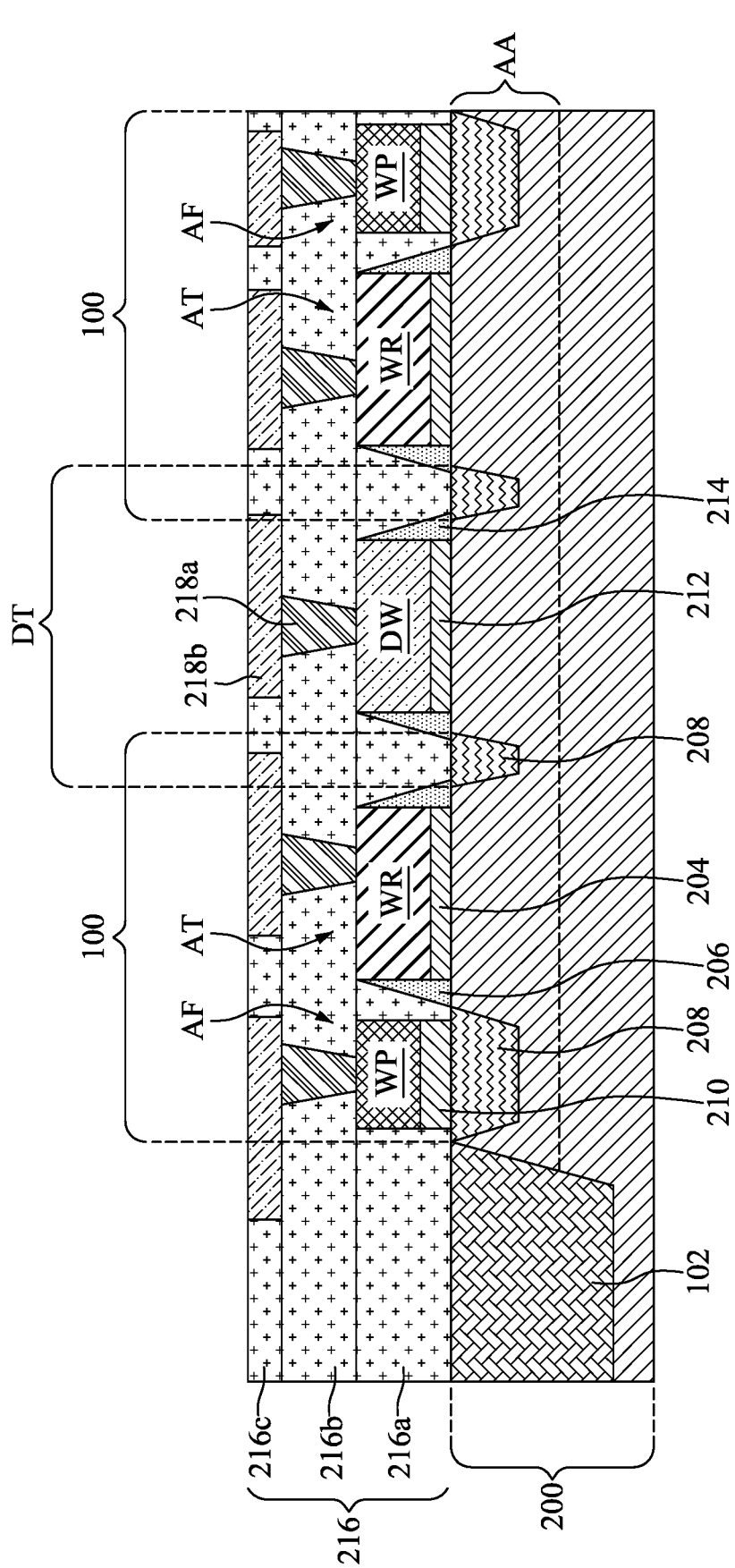
FIG. 2 is a schematic cross-sectional view illustrating two adjacent unit cells arranged along the row direction as shown in FIG. 1A, according to some embodiments of the present disclosure.

FIG. 2 is a schematic cross-sectional view illustrating two adjacent unit cells 100 arranged along the row direction (i.e., the direction X) as shown in FIG. 1A, according to some embodiments of the present disclosure.

Referring to FIG. 2, two adjacent unit cells 100 formed on an edge portion of an active area AA are schematically depicted. The active area AA may be a well region in a semiconductor substrate 200, and may extend into the semiconductor substrate 200 from a top surface of the semiconductor substrate 200. In addition, the active area AA is laterally surrounded by the isolation structure 102. The isolation structure 102 may be a trench isolation structure extending into the semiconductor substrate 200 from the top surface of the semiconductor substrate 200 by a depth greater than, equal to or less than a depth of the active area AA. As described with reference to FIG. 1A, the isolation structure 102 may, not extend in between the adjacent unit cells 100 arranged along the row direction. In some embodiments, the semiconductor substrate 200 is a semiconductor wafer (e.g., a silicon wafer) or a semiconductor-on-insulator (SOI) wafer (e.g., a silicon-on-insulator wafer), and the isolation structure 102 is formed of an insulating material, such as silicon oxide, silicon nitride, silicon oxynitride, the like or combinations thereof.

The access transistor AT in each of the unit cells 100 includes a read word line WR lying over the active area AA. The read word line WR is in contact with the active area AA through a gate dielectric layer 204, so as to be capacitively coupled to the active area AA. In some embodiments, a stacking structure including the read word line WR and the gate dielectric layer 204 is laterally surrounded by a gate spacer 206. According to some embodiments, the read word line WR is formed of polysilicon, while the gate dielectric layer 204 is formed of silicon oxide. In addition, the gate spacer 206 may be a single layer or a multilayer structure formed of silicon oxide, silicon nitride, silicon oxynitride, the like or combinations thereof. However, other suitable materials may be used for forming the read word line WR, the gate dielectric layer 204 and the gate spacer 206, the present disclosure is not limited to the materials of these elements.

Each access transistor AT further includes source/drain structures 208 at opposite sides of the read word line WR. The source/drain structures 208 are functioned as source and drain terminals of the access transistor AT. In some embodiments, the source/drain structures 208 are doped regions in the semiconductor substrate 200, and extend into the active area AA from the top surface of the semiconductor substrate 200. In alternative embodiments, the source/drain structures 208 are epitaxial structures formed in recesses at the top surface of the semiconductor substrate 200. The source/drain structures 208 may or may not laterally extend to regions under the gate spacer 206. A conductive type of the source/drain structures 208 may be complementary to a conductive type of the active area AA. For instance, the active area AA is P-type, while the source/drain structures 208 are N-type. Further, dimensions of the source/drain structures may be identical or different from each other.

One of the source/drain structures 208 of each access transistor AT may be functioned as a terminal of the anti-fuse storage element AF in the same unit cell 100, and is described as the common node CN with reference to FIG. 1B. A programming word line WP lying above this source/drain structure 208 is functioned as the other terminal of the anti-fuse storage element AF. The programming word line WP is in contact with this source/drain structure 208 through a capacitor dielectric layer 210, so as to be capacitively coupled to such source/drain structure 208. When an anti-fuse storage element AF is selected to be programmed, a breakdown may occur in the capacitor dielectric layer 210 due to a great voltage bias between the two terminals of the anti-fuse storage element AF. As a result of the breakdown, the two terminals of the anti-fuse storage element AF may be shorted, and the anti-fuse storage element AF can be considered as being programmed with a low resistance state. The programming word line WP is formed of a conductive material, which may be identical with or different from the conductive material for forming the read word line WR. For instance, in those embodiments where the read word line WR is formed of poly silicon, the programming word line WP may be formed of tungsten. Further, the capacitor dielectric layer 210 may be formed of a dielectric material identical with or different from the dielectric material for forming the gate dielectric layer 204. For instance, in those embodiments where the gate dielectric layer 204 is formed of silicon oxide, the capacitor dielectric layer 210 may be formed of silicon oxide or a high-k dielectric material. Moreover, thicknesses of the programming word line WP and the capacitor dielectric layer 210 may be identical or different from thicknesses of the read word line WR and the gate dielectric layer 204, respectively. However, a total thickness of the programming word line WP and the capacitor dielectric layer 210 may be substantially identical with a total thickness of the read word line WR and the gate dielectric layer 204.

The isolation transistor DT between adjacent unit cells 100 includes the dummy word line DW as a gate terminal. The source/drain structures 208 located at opposite sides of the dummy word line DW from the access transistors AT in adjacent unit cells 100 may be functioned as source and drain terminal of the isolation transistor DT. As described with reference to FIG. 1A, although not shown, some of the isolation transistors DT may be respectively located between two anti-fuse storage elements AF from adjacent unit cells 100, and the source/drain structures 208 as terminals of these anti-fuse storage elements AF may be functioned as source and drain terminals of these isolation transistors DT. The dummy word line DW is in contact with the active area AA through a gate dielectric layer 212, so as to be capacitively coupled to the active area AA. In addition, a stacking structure including the dummy word line DW and the gate dielectric layer 212 may be laterally surrounded by a gate spacer 214. The source/drain structures 208 as source and drain terminals of the isolation transistor DT may or may not extend to regions under the gate spacer 214. According to some embodiments, the dummy word line DW is formed of the conductive material used for forming the read word line WR (e.g., polysilicon); the gate dielectric layer 212 is formed of the dielectric material used for forming the gate dielectric layer 204 (e.g., silicon oxide); and the gate spacer 214 is formed of the insulating material(s) used for forming the gate spacer 206 (e.g., silicon oxide, silicon nitride, silicon oxynitride, the like or combinations thereof). However, the present disclosure is not limited to the materials for forming the dummy word line DW, the gate dielectric layer 212 and the gate spacer 214 as well. Further, according to some embodiments of the present disclosure, the dummy word line DW, the gate dielectric layer 212 and the gate spacer 214 are structurally identical with the read word line WR, the gate dielectric layer 204 and the gate spacer 206, respectively. However, the dummy word line DW, the gate dielectric layer 212 and the gate spacer 214 may be different from the read word line WR, the gate dielectric layer 204 and the gate spacer 206 in terms of dimensions and/or shapes.

In some embodiments, a channel length of each isolation transistor DT (measured from one of the source/drain structures 208 of the isolation transistor DT to the other) is ensured to be long enough that the isolation transistor DT can be avoided from being accidentally turned on. The channel length of the isolation transistor DT may be adjusted by methods including modifying a width of the dummy word line DW, and/or modifying a thickness of the gate spacer 214 used for defining the source/drain structures 208 of the isolation transistor DT.

A stack of insulating layers 216 may be disposed on the semiconductor structure 200. Components of the access transistors AT, the anti-fuse storage elements AF and the isolation transistors DT above the top surface of the semiconductor substrate 200 may be laterally surrounded by a bottommost one of the insulating layers 216, and covered by others of the insulating layers 216. For instance, the insulating layers 216 may include an insulating layer 216a, an insulating layer 216b and an insulating layer 216c. The read word lines WR and the underlying gate dielectric layers 204 as well as the surrounding gate spacers 206 of the access transistors AT; the programming word lines WP and the underlying capacitor dielectric layers 210 of the anti-fuse storage elements AF; and the dummy word lines DW as well as the underlying gate dielectric layers 212 and the surrounding gate spacers 214 of the isolation transistors DT may be laterally surrounded by the insulating layer 216a. In addition, the insulating layer 216b is stacked on the insulating layer 216a, and covered by the insulating layer 216c. The insulating layers 216 are each formed of an insulating material, such as silicon oxide, silicon nitride, silicon oxynitride or the like. In some embodiments, a contact etching stop layer (not shown) is lying along a bottom surface of the bottommost one of the insulating layers 216 (e.g., the insulating layer 216a), and has a sufficient etching selectivity with respect to the insulating layers 216. Further, additional etching stop layer(s) may be further disposed between adjacent ones of the insulating layers 216, and may have sufficient etching selectivity with respect to the insulating layers 216 as well.

Routing elements 218 are formed in the stack of insulating layers 216, and configured to out-rout the access transistors AT, the anti-fuse storage elements AF and the isolation transistors DT. The routing elements 218 may include conductive vias 218a and conductive traces/pads 218b. Each of the conductive vias 218a may penetrate through one or more of the insulating layers 216 along a stacking direction of the insulating layers 216, to provide a vertical conductive path in the insulating layers 216. On the other hand, each of the conductive traces/pads 218b may laterally extend in one of the insulating layers 216, to provide a horizontal conductive path. As shown in FIG. 2, the read word lines WR, the programming word lines WP and the dummy word lines DW are out-routed by combinations of the conductive vias 218a and the conductive traces/pads 218b. Although not shown, the source/drain structures 208 of the access transistors AT that are not shared by the anti-fuse storage elements AF may be routed to the bit lines BL as described with reference to FIG. 1A, by some of the routing elements 218.

It should be noted that, although not shown, a complete back-end-of-line (BEOL) structure may include more of the insulating layers 216 and the routing elements 218 stacked along a vertical direction. Moreover, in addition to the anti-fuse OTP memory, array 10, other integrated circuits may also be formed in/on the semiconductor substrate 200, but occupy a different region.

As mentioned above, each active area AA may continuously extend along the row direction (i.e., the direction X) through a row of the unit cells 100 without being disrupted by the isolation structure 102. Instead of using the isolation structure 102 for blocking the crosstalk between adjacent unit cells 100 arranged along the row direction, the isolation transistors DT are disposed in between these adjacent unit cells 100 for ensuring isolation between these adjacent unit cells 100. Consequently, isolation between these adjacent unit cells 100 can be realized by using a smaller footprint area, thus a memory density can be increased. Furthermore, by avoiding separating each active area AA into multiple segments by the isolation structure 102, a possible stress effect (resulted during formation of the isolation structure 102) on the unit cells 100 can be effectively reduced.

On the other hand, isolation between the unit cells 100 arranged along the column direction (i.e., the direction Y) may still be realized by the isolation structure 102. In other words, the active areas AA arranged along the column direction (i.e., the direction Y) are separated from one another by the isolation structure 102.

Figure 3:
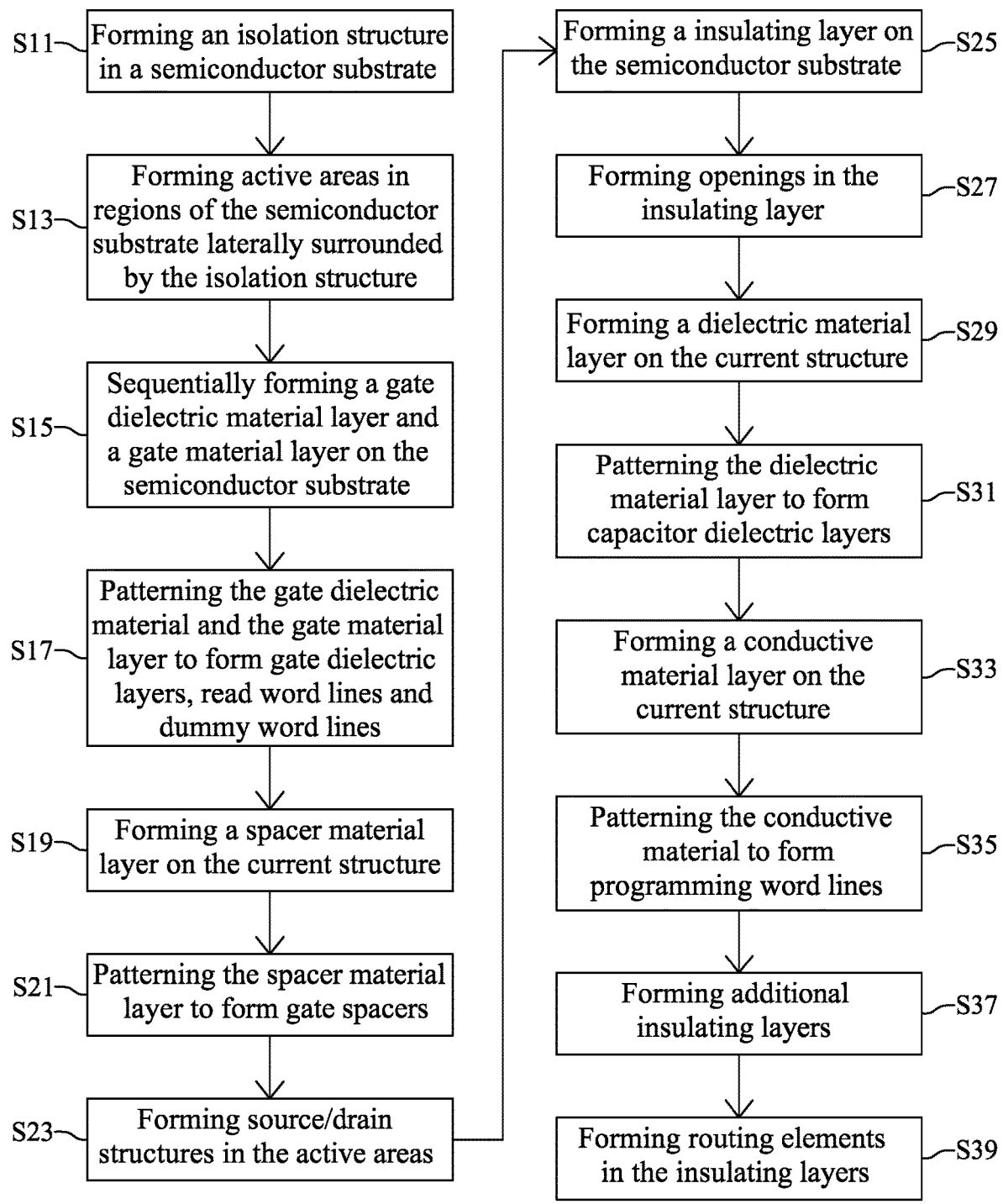
FIG. 3 is a flow diagram illustrating a method for manufacturing the structure as shown in FIG. 2, according to some embodiments of the present disclosure.

FIG. 3 is a flow diagram illustrating a method for manufacturing the structure as shown in FIG. 2, according to some embodiments of the present disclosure. FIG. 4A through FIG. 4M are schematic cross-sectional views illustrating intermediate structures at various stages during the manufacturing process as shown in FIG. 3.

Figure 4A:
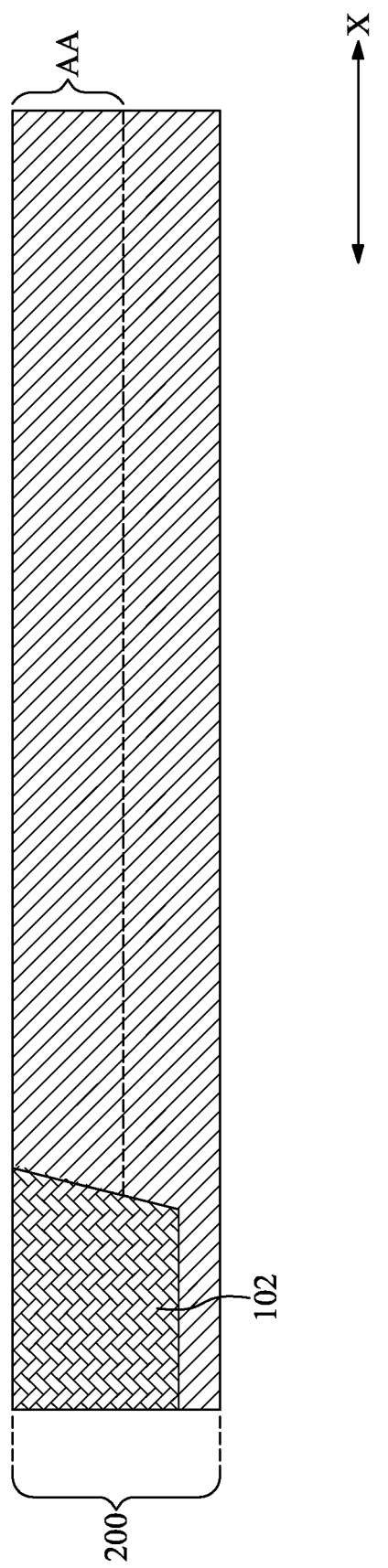
FIG. 4A through FIG. 4M are schematic cross-sectional views illustrating intermediate structures at various stages during the manufacturing process as shown in FIG. 3.

Referring to FIG. 3 and FIG. 4A, step S11 is performed, and the isolation structure 102 is formed in the semiconductor substrate 200. As described above, the isolation structure 102 defines boundaries of the active areas AA to be formed in the following step. In some embodiments, a method for forming the isolation structure 102 includes forming a recess at the top surface of semiconductor substrate 200 by a lithography process and an etching process (e.g., an anisotropic etching process). Subsequently, an insulating material is formed on the recessed semiconductor substrate 200 by a deposition process, such as a chemical vapor deposition (CND) process. Further, portions of the insulating material above the top surface of the semiconductor substrate 200 may be removed by a planarization process, and remained portions of the insulating material form the isolation structure 102. For instance, the planarization process may include a polishing process, an etching process or a combination thereof.

Thereafter, step S13 is performed, and the active areas AA are formed in regions of the semiconductor substrate 200 laterally surrounded by the isolation structure 102. In some embodiments, a method for forming the active areas AA may include an ion implantation process. During the ion implantation process, the isolation structure 102 may be functioned as a mask pattern.

In alternative embodiments, the ion implantation process is performed before formation of the isolation structure 102. In these alternative embodiments, a well region is formed by the ion implantation process, and the isolation structure 102 is then formed in this well region. Portions of the well region laterally surrounded by the isolation structure 102 may form the active areas AA.

Figure 4B:
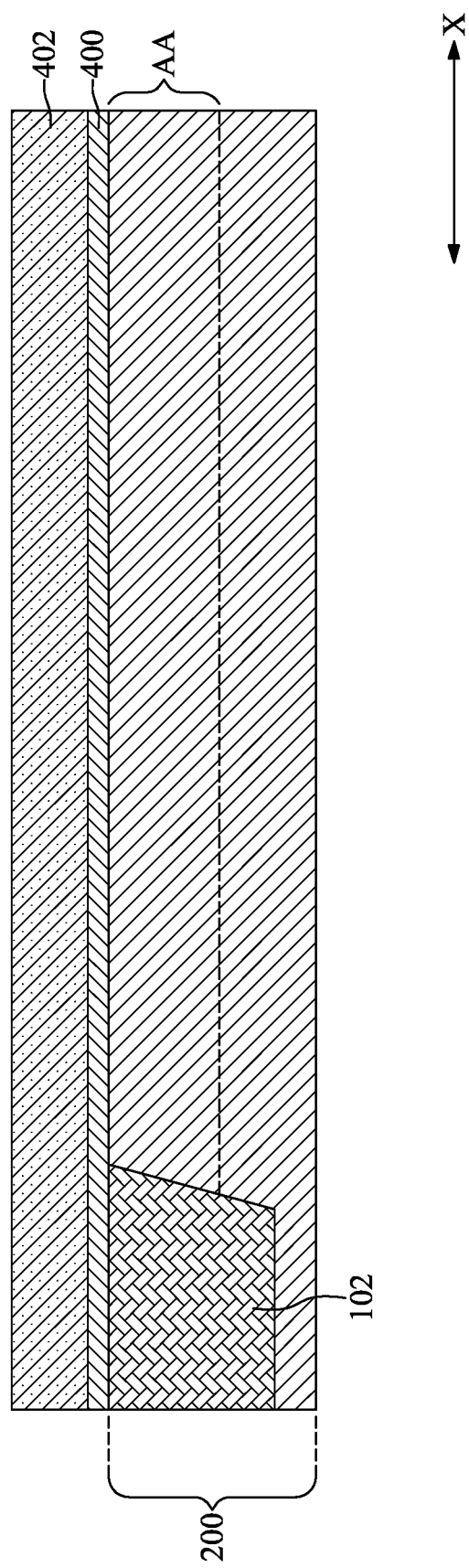

Referring to FIG. 3 and FIG. 4B, step S15 is performed, and a gate dielectric material layer 400 and a gate material layer 402 are sequentially formed on the semiconductor substrate 200. The gate dielectric material layer 400 will be patterned to form the gate dielectric layers 204, 212, while the gate material layer 402 will be patterned to form the read word lines WR and the dummy word lines DW. In some embodiments, the gate dielectric material layer 400 is formed of an oxidation process or a deposition process (e.g., a CVD process), and a method for forming the gate material layer 402 includes a deposition process a CVD process).

Figure 4C:
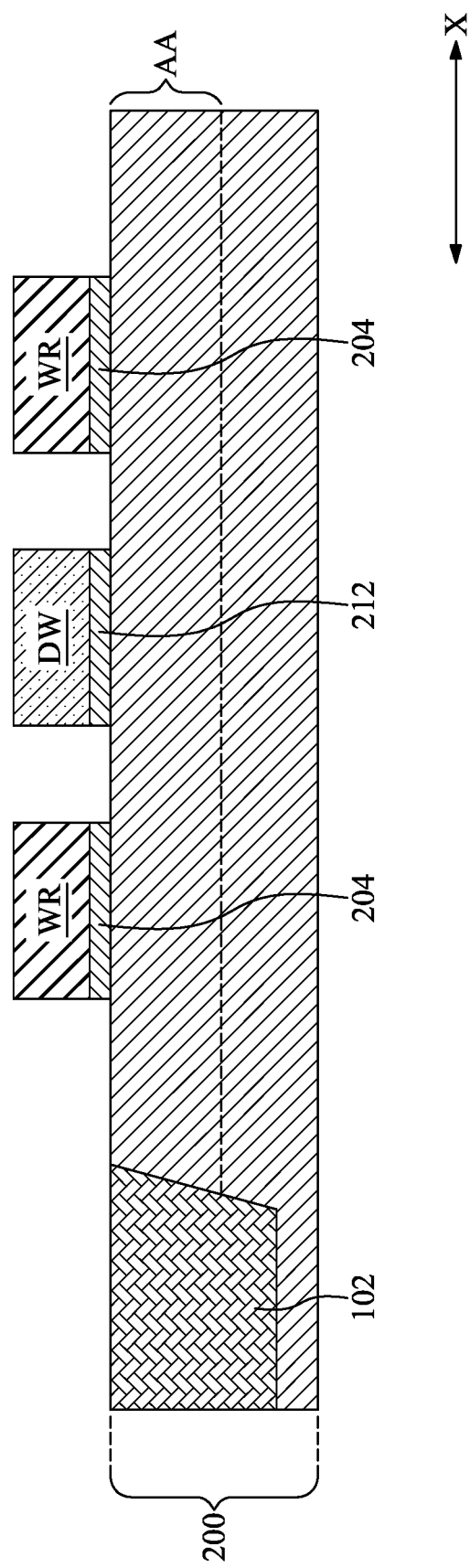

Referring to FIG. 3 and FIG. 4C, step S17 is performed, such that the gate dielectric material layer 400 is patterned to form the gate dielectric layers 204, 212, and the gate material layer 402 is patterned to form the read word lines WR and the dummy word lines DW. In some embodiments, a method for patterning the gate dielectric material layer 400 and the gate material layer 402 includes a lithography process and at least one etching process (e.g., at least one anisotropic etching process). In alternative embodiments, hard mask patterns (not shown) are formed on the gate material layer 402, and then the gate material layer 402 as well as the gate dielectric material layer 400 are etched to form the gate dielectric layers 204, 212, the read word lines WR and the dummy word lines DW by using the hard mask patterns as shadow masks. In these alternative embodiments, the read word lines WR and the dummy word lines DW may remain covered by the hard mask patterns after the patterning process.

Figure 4D:
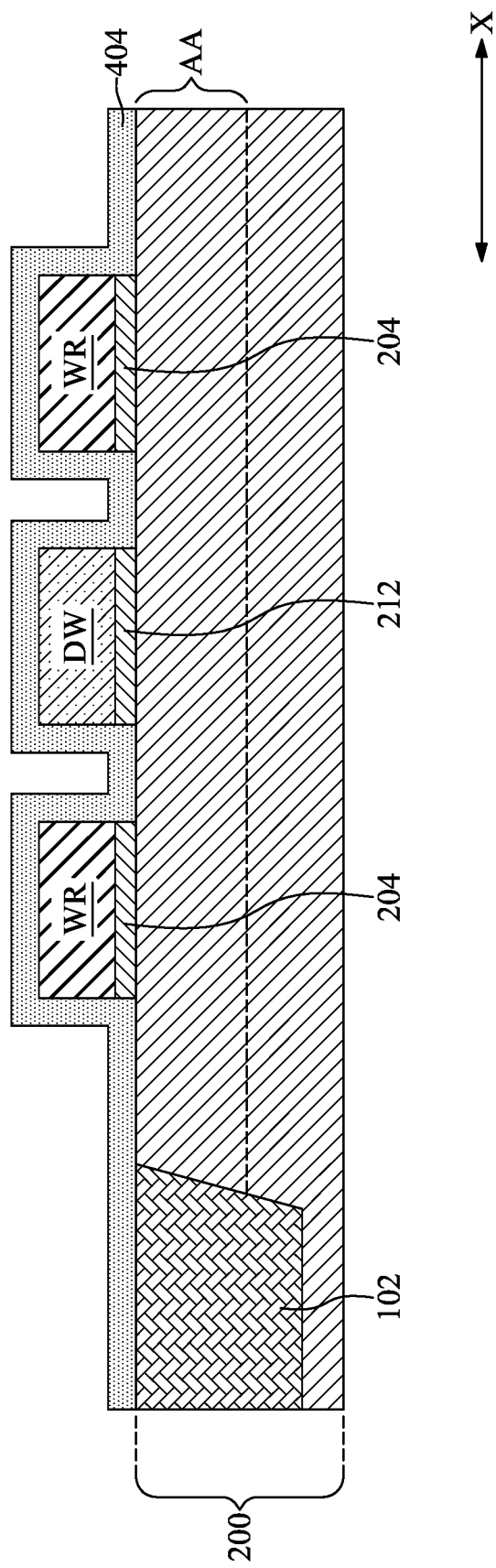

Referring to FIG. 3 and FIG. 4D, step 419 is performed, and a spacer material layer 404 is formed on the current structure. The spacer material layer 404 will be patterned to form the gate spacers 206, 214. Currently, the spacer material layer 404 may globally and conformally cover the structure as shown in FIG. 4C. In some embodiments, method for forming the spacer material layer 404 includes a deposition process, such as a CND process.

Figure 4E:
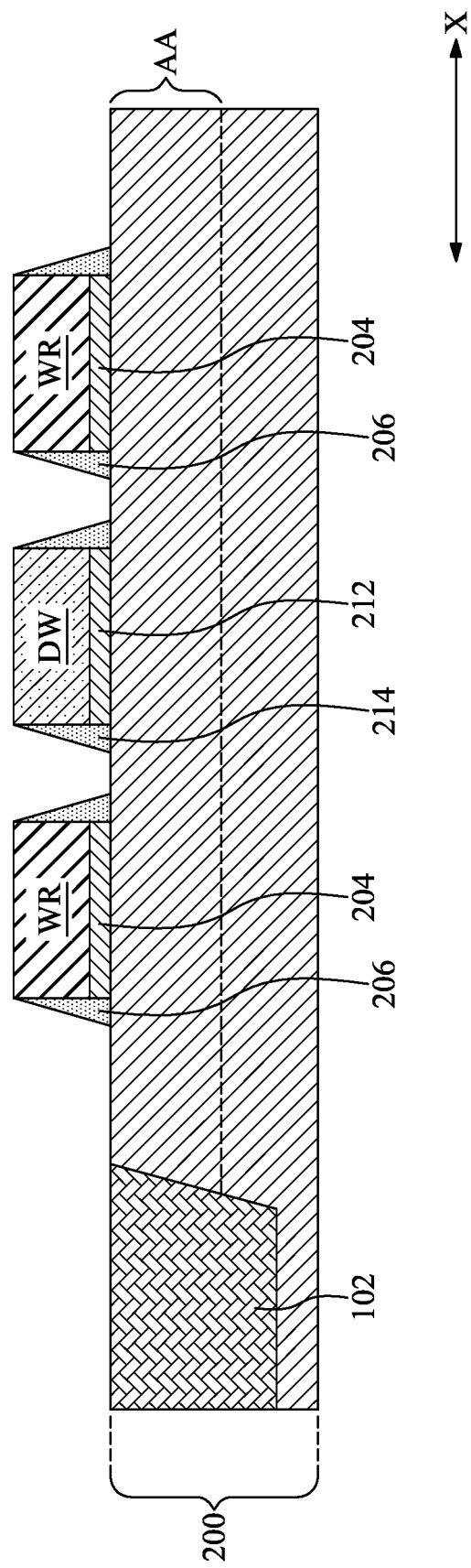

Referring to FIG. 3 and FIG. 4E, step S21 is performed, and the spacer material layer 404 is patterned to form the gate spacers 206, 214. In some embodiments, portions of the spacer material layer 404 lining along the top surface of the semiconductor substrate 200, a top surface of the isolation structure 102, top surfaces of the read word lines WR and top surfaces of the dummy word lines DW are removed by an etching process, such as an anisotropic etching process. Remained portions of the spacer material layer 404 form the gate spacers 206, 214. Since a lithography process may not be used during such patterning, the formation of the gate spacers 206, 214 may be considered as a self-aligning process.

Figure 4F:
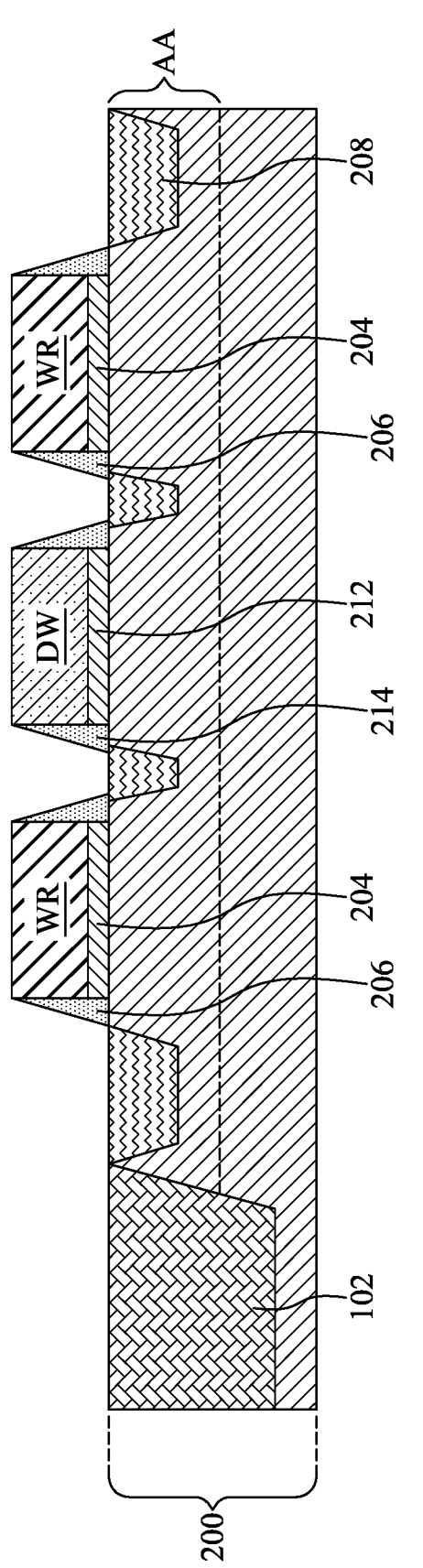

Referring to FIG. 3 and FIG. 4F, step S23 is performed, and the source/drain structures 208 are formed in the active areas AA. In some embodiments, a method for forming the source/drain structures 208 includes an ion implantation process. During the ion implantation process, the read word lines WR, the dummy word lines DW and the gate spacers 206, 214 may be functioned as shadow masks. In those embodiments where the read word lines WR and the dummy word lines DW are remained covered by the hard mask patterns, these hard mask patterns may shield off incident ions during the ion implantation process, along with the gate spacers 206, 214, Further, in some embodiments, a thermal treatment as a drive-in process may follow the ion implantation process. Since a lithography process may not be used for forming the source/drain structures 208, the formation of the source/chain structures 208 may be considered as a self-aligning process.

Figure 4G:
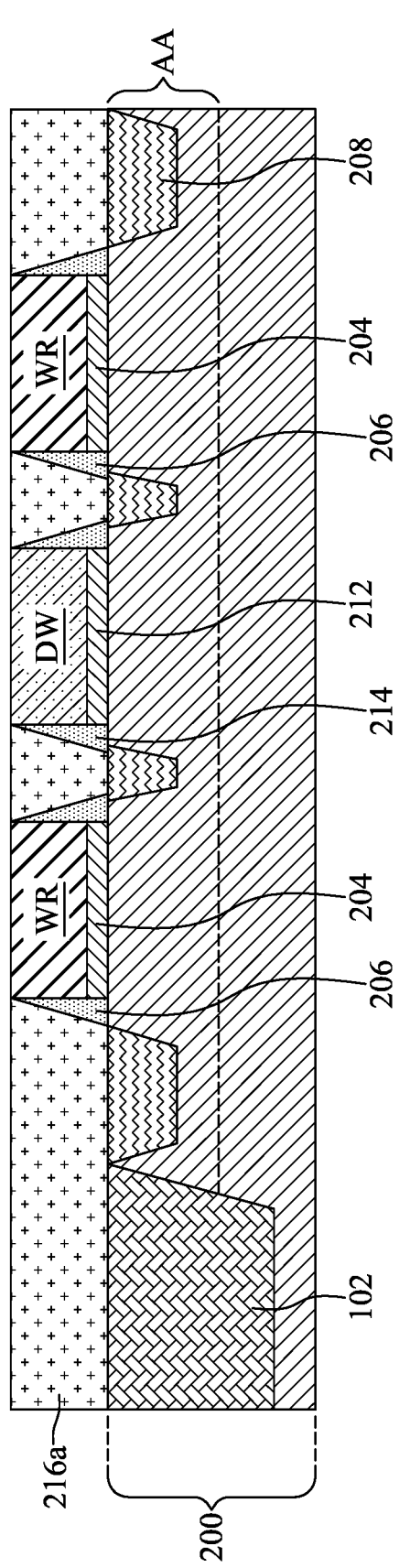

Referring to FIG. 3 and FIG. 4G, step S25 is performed, and the insulating layer 216a is formed on the semiconductor substrate 200. In some embodiments, a method for forming the insulating layer 216a includes forging an insulating material layer to globally cover the structure as shown in FIG. 4F by a deposition process, such as a CVD process. Subsequently, portions of the insulating material layer above the read word lines WR and the dummy word lines DW may be removed by a planarization process (e.g., a polishing process, an etching process or a combination thereof), and remained portions of the insulating material layer form the insulating layer 216a. In those embodiments where the read word lines WR and the dummy word lines WR are covered by the hard mask patterns, the hard mask patterns may be removed during the planarization process, along with the portions of the insulating material layer. Alternatively, the hard mask patterns may remain, and top surfaces of the hard mask patterns may be substantially coplanar with a top surface of the insulating layer 216a.

Figure 4H:
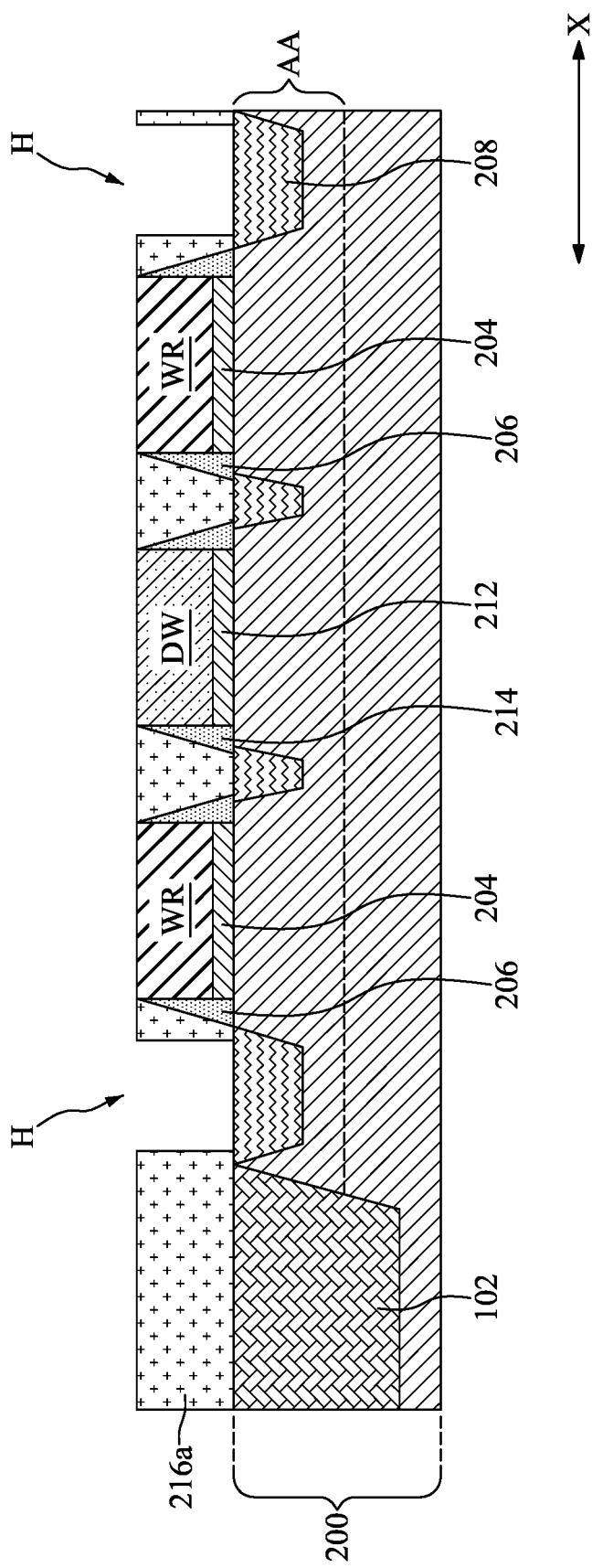

Referring to FIG. 3 and FIG. 4H, step S27 is performed, and openings H are formed in the insulating layer 216a. The openings H are configured to accommodate the capacitor dielectric layers 210 and the programming word lines WP to be formed in the following steps, and penetrate through the insulating layer 216a, to reach the source/drain structures 208 as the common nodes CN described with reference to FIG. 1A and FIG. 1B. According to some embodiments, a method fir forming the openings H includes a lithography process and an etching process (e.g., an anisotropic etching process).

Figure 4I:
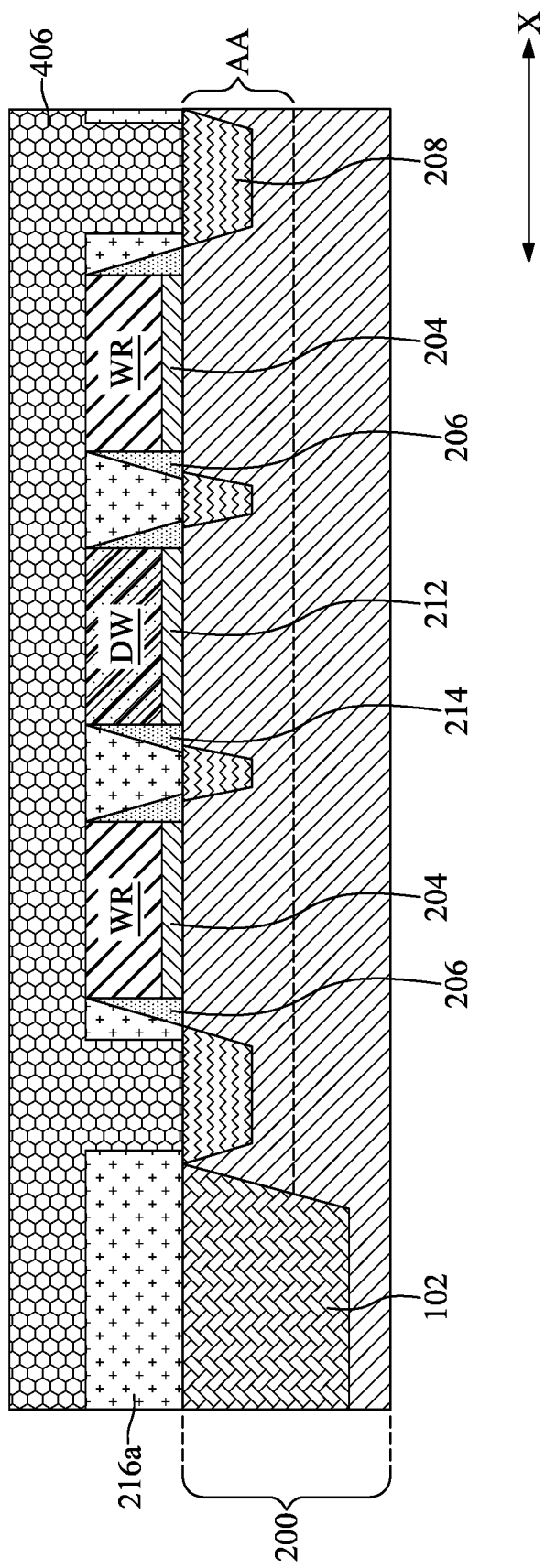

Referring to FIG. 3 and FIG. 4I, step S29 is performed, and a dielectric material layer 406 is formed on the current structure. The dielectric material layer 406 will be patterned to form the capacitor dielectric layers 210 in the following step. Currently, the dielectric material layer 406 may extend along the top surface of the insulating layer 216a, and may fill up the openings H, In some embodiments, a method for forming the dielectric material layer 406 includes a deposition process, such as a CVD process.

Figure 4J:
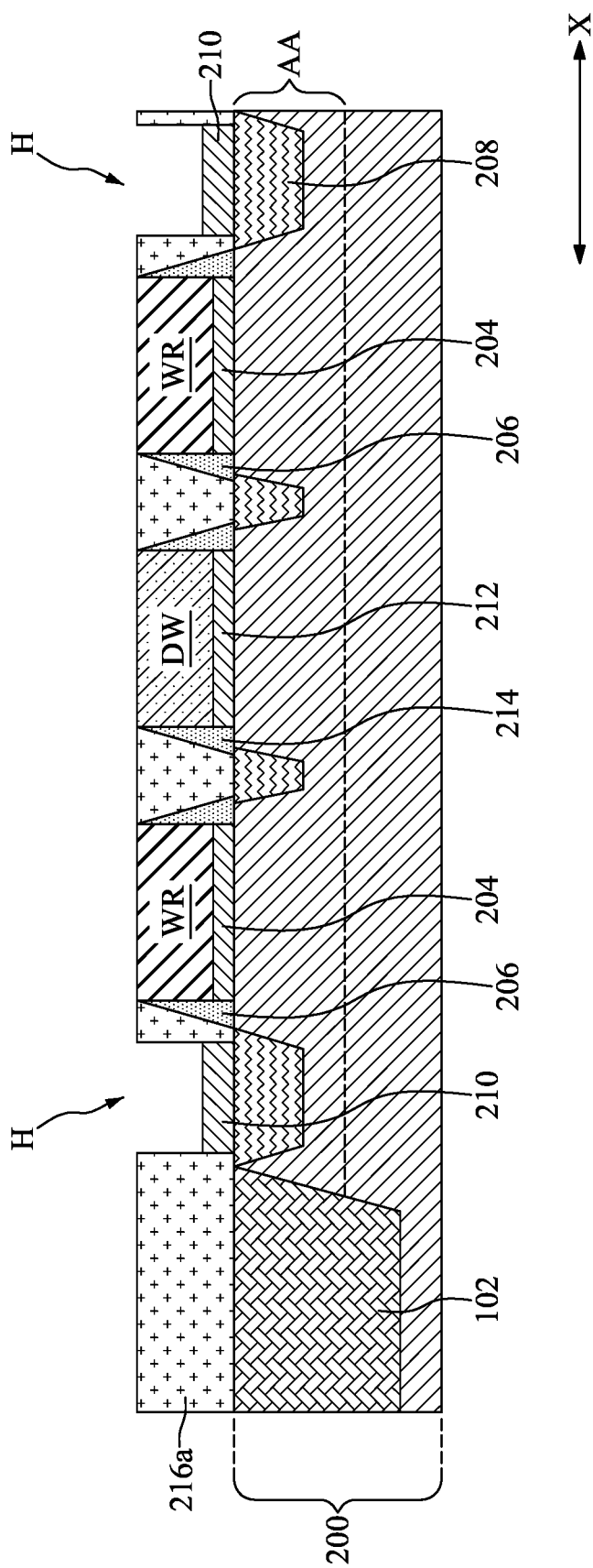

Referring to FIG. 3 and FIG. 4J, step S31 is performed, and the dielectric material layer 406 is patterned to form the capacitor dielectric layers 210. During the patterning, portions of the dielectric material layer 406 above the insulating layer 216a may be removed by, for example, a planarization process, such as a polishing process, an etching process or a combination thereof. Further, portions of the dielectric material layer 406 in the openings H are recessed by, for example, an etching process, such as an isotropic etching process. The resulting portions of the dielectric material layer 406 form the capacitor dielectric layers 210.

Figure 4K:
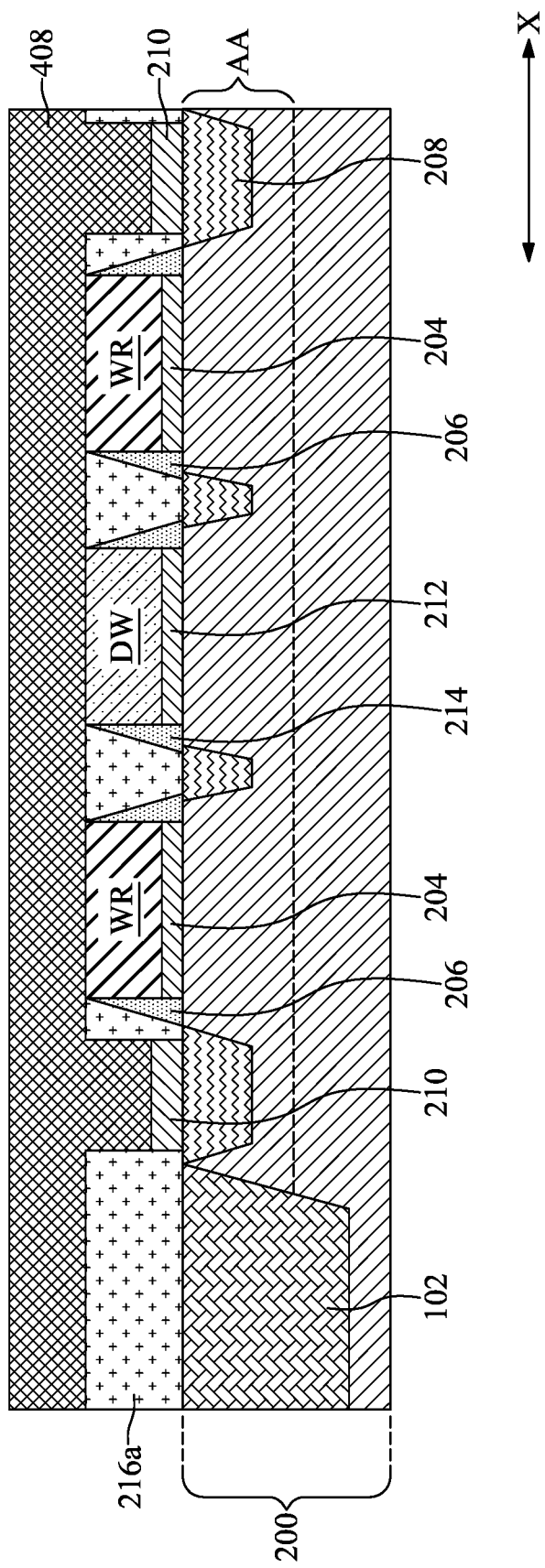

Referring to FIG. 3 and FIG. 4K, step S33 is performed, and a conductive material layer 408 is formed on the current structure. The conductive material layer 408 will be patterned to limn the programming word lines WP in the following step. Currently, the conductive material layer 408 may extend along the top surface of the insulating layer 216a, and may Fill up the openings H. Accordingly, the capacitor dielectric layers 210 are covered by the conductive material layer 408. In some embodiments, a method for forming the conductive material layer 408 includes a deposition process (e.g., a physical vapor deposition (PVD) process), a plating process or a combination thereof.

Figure 4L:
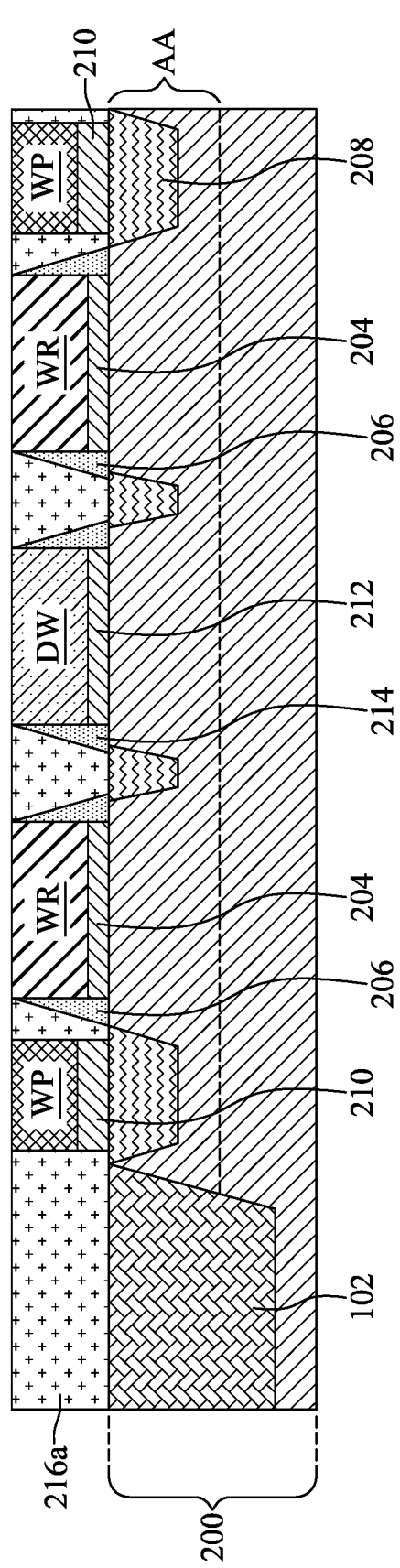

Referring to FIG. 3 and FIG. 4L, step S35 is performed, and the conductive material layer 408 is patterned to form the programming word lines WP. The patterning may include removal of portions of the conductive material layer 408 above the top surface of the insulating layer 216a, In some embodiments, such removal is realized by a planarization process. For instance, the planarization process may include a polishing process, an etching process or a combination thereof.

Figure 4M:
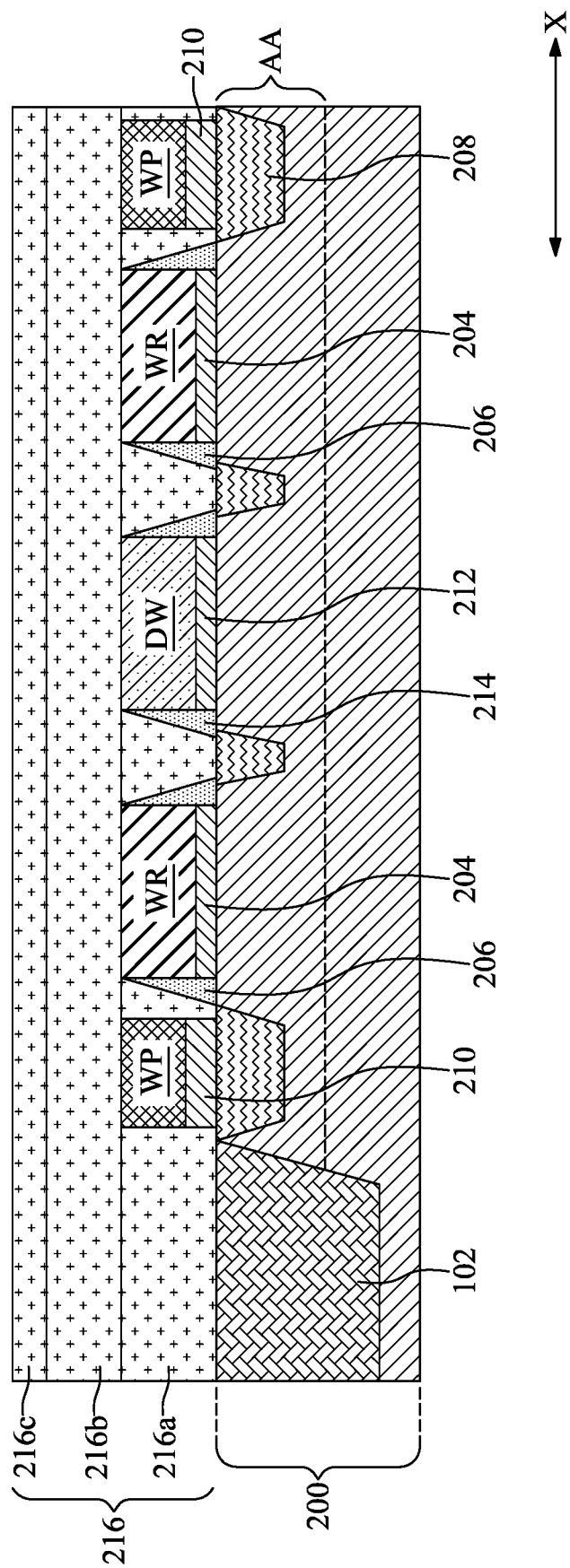

Referring to FIG. 3 and FIG. 4M, step S37 is performed, and the insulating layers 216b, 21.6c are formed on the insulating layer 216a. In some embodiments, a method for forming each of the insulating layers 216b, 216c includes a deposition process, such as a CND process.

In some embodiments, although not shown, some conductive vias (or referred as contact plugs) may be formed in the insulating layer 216a before formation of the insulating layers 216b. 216c, for out-routing some of the source/drain structures 208.

Referring to FIG. 3 and FIG. 2, step S39 is performed after formation of the insulating layers 216b, 216c, and the routing elements 218 are formed in the insulating layers 216b, 216c. In some embodiments, at least one damascene process is used for forming the routing elements 218.

Figure 5:
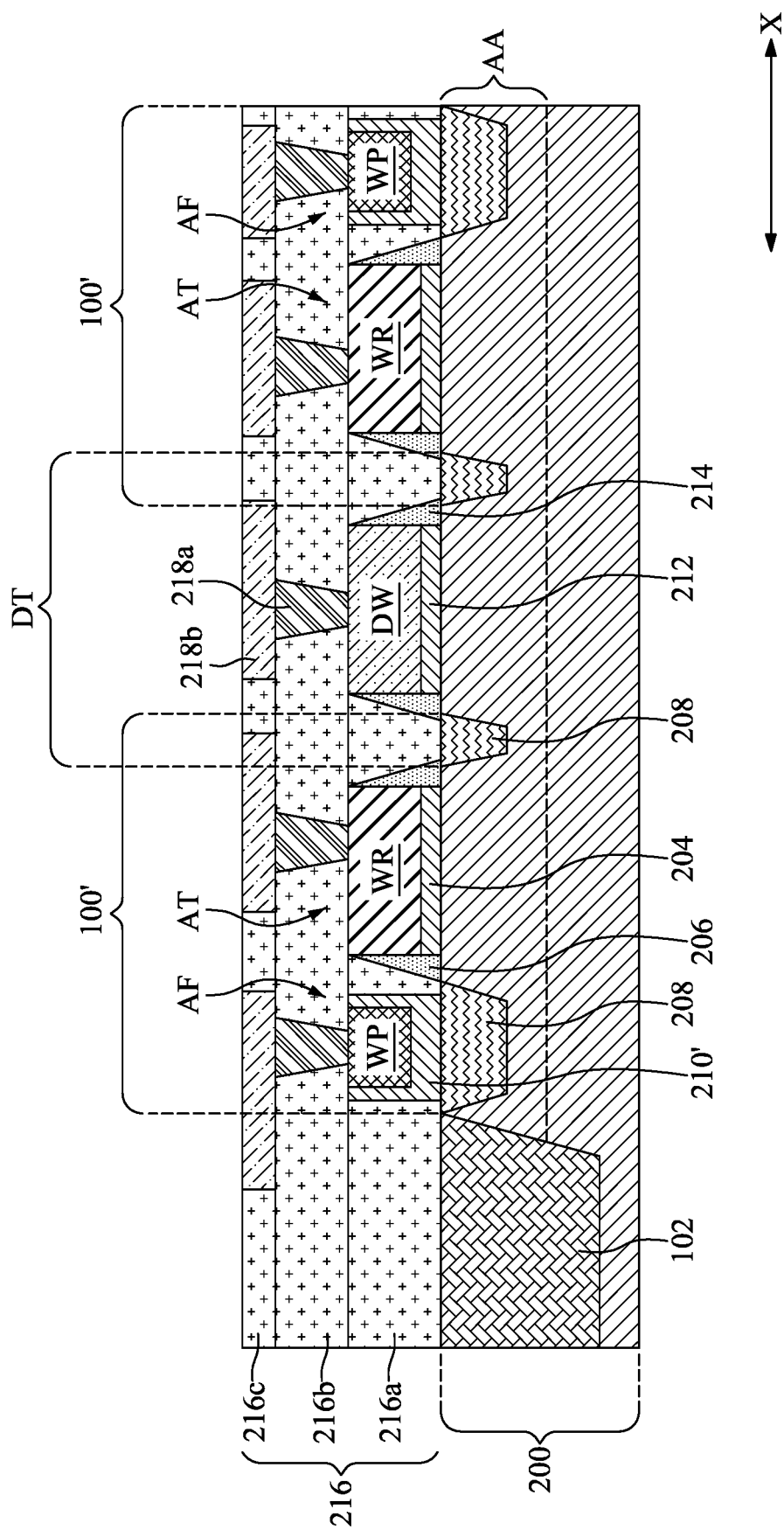
FIG. 5 is a schematic cross-sectional view illustrating two adjacent unit cells arranged along the row direction, according to alternative embodiments of the present disclosure.

Up to here, the structure as shown in FIG. 2 has been formed. Further BEOL process may be further performed on such structure to complete formation of a device wafer. In addition, the device wafer may be subjected to a packaging process to form device dies, FIG. 5 is a schematic cross-sectional view illustrating two adjacent unit cells 100' arranged along the row direction (i.e., the direction X), according to alternative embodiments of the present disclosure. The unit cells 100' are similar to the unit cells 100 as described with reference to FIG. 2, thus only differences between the unit cells 100, 100' will be described. The same or the like parts in the unit cells 100, 100' would not be repeated again.

Referring to FIG. 5, in some embodiments, capacitor dielectric layers 210' further extend along sidewalls of the programming word lines \VP, such that the programming word lines WP are in lateral contact with the insulating layer 216a through the further extending portions of the capacitor dielectric layers 210'. In these embodiments, the programming word lines WP may be considered as disposed in recesses defined by the capacitor dielectric layers 210'. In addition, topmost surfaces of the capacitor dielectric layers 210' may be substantially coplanar with top surfaces of the programming word lines WP.

Figure 6A:
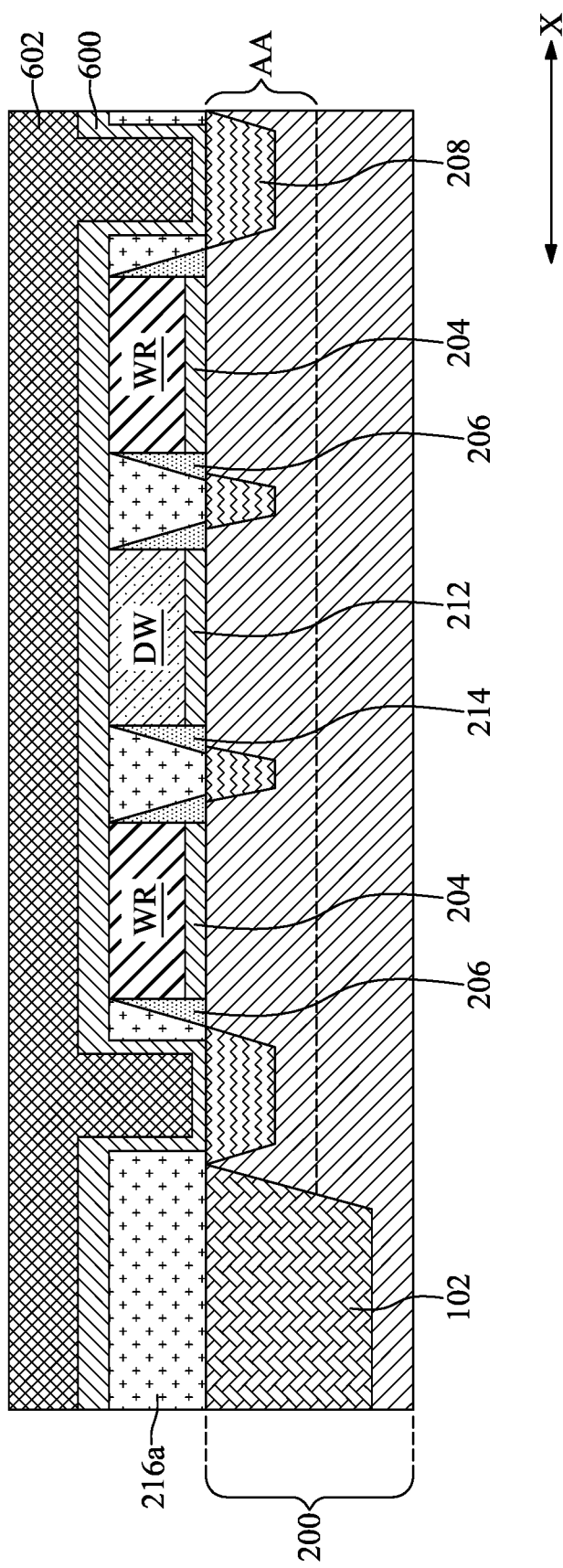
FIG. 6A and FIG. 6B are schematic cross-sectional views illustrating intermediate structures during formation of the structure as shown in FIG. 5, according to some embodiments of the present disclosure.
Figure 6B:
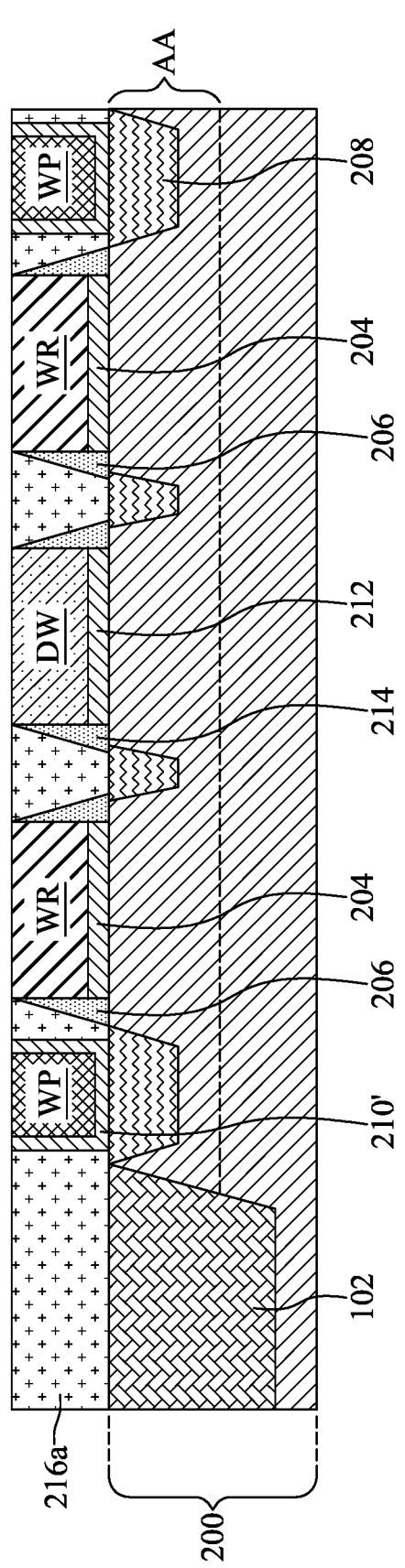

FIG. 6A and FIG. 6B are schematic cross-sectional views illustrating intermediate structures during formation of the structure as shown in FIG. 5, according to some embodiments of the present disclosure.

Referring to FIG. 6A, in regarding a method for forming the capacitor dielectric layers 210' and the programming word lines WP as shown in FIG. 5, a dielectric material layer 600 may be conformally formed on the resulting structure after forming the openings H in the insulating layer 216a as described with reference to FIG. 4H. The dielectric material layer 600 will be patterned to form the capacitor dielectric layers 210'. Currently, the dielectric material layer 600 may define recesses in corresponding to the openings H. In some embodiments, a method for forming the dielectric material layer 600 includes a deposition process, such as a CVD process.

Subsequently, a conductive material layer 602 is formed on the dielectric material layer 600. The conductive material layer 602 may fill up the recesses defined by the dielectric material layer 600, and will be patterned to limn the programming word lines WP. In some embodiments, a method for forming the conductive material layer 602 includes a deposition process (e.g., a PVD process), a plating process or a combination thereof.

Referring to FIG. 6B, portions of the dielectric material layer 600 and the conductive material layer 602 above the top surface of the insulating layer 216a are removed. Remained portions of the dielectric material layer 600 form the capacitor dielectric layers 210', while remained portions of the conductive material layer 602 form the programming word lines WP. In some embodiments, a planarization process is performed to remove the portions of the dielectric material layer 600 and the conductive material layer 602 above the top surface of the insulating layer 216a. For instance, the planarization process may include a polishing process, an etching process or a combination thereof.

Further process as described with reference to FIG. 3, FIG. 4M and FIG. 2 may be performed to form the structure as shown in FIG. 5.

As above, an anti-fuse OTP memory array is provided. Each active area in the anti-fuse OTP memory array continuously extend along through a row of unit cells without being disrupted by an isolation structure. Instead of using the isolation structure for blocking crosstalk between adjacent unit cells arranged along the row direction, isolation transistors are disposed in between these adjacent unit cells for ensuring isolation between these adjacent unit cells. Consequently, isolation between these adjacent unit cells can be realized by using a smaller footprint area, thus a memory density of the anti-fuse OTP memory array can be increased. Furthermore, by avoiding separating each active area into multiple segments by the isolation structure, a possible stress effect (resulted during formation of the isolation structure) on the unit cells can be effectively reduced.

In an aspect of the present disclosure, an anti-fuse OTP memory array is provided. The anti-fuse OTP memory array comprises: active areas, extending along a first direction in a semiconductor substrate, and separately arranged along a second direction; pairs of programming word lines and read word lines, extending along the second direction over the semiconductor substrate, wherein a region in which one of the pairs of programming word lines and read word lines are intersected with one of the active areas defines a unit cell in the anti-fuse OTP memory array; and dummy word lines, extending along the second direction over the semiconductor substrate, and respectively lying between adjacent pairs of programming word lines and read word lines, wherein a region in which one of the dummy word lines is intersected with one of the active areas defines an isolation transistor.

In another aspect of the present disclosure, an anti-fuse OTP memory array is provided. The anti-fuse OTP memory array comprises: unit cells, arranged along columns and rows, and each comprising an access transistor and an anti-fuse storage element electrically coupled to a source/drain terminal of the access transistor; and isolation transistors, each electrically coupled to adjacent ones of the unit cells in the same row, and configured to be kept in an off state, to electrically isolate the adjacent ones of the unit cells from each other.

In yet another aspect of the present disclosure, an anti-fuse OTP memory array is provided. The anti-fuse OTP memory array comprises: an active area, laterally extending in a semiconductor substrate; a first read word line and a first programming word line, extending over and intersected with the active area, and spaced apart from each other, wherein a first unit cell of the anti-fuse OTP memory array is defined in a region in which the first read word line and the first programming word line are intersected with the active area; a pair of first source/drain structures, disposed in the active area and within the first unit cell, wherein the first read word line is located between the pair of first source/drain structures, and the first programming word line overlaps one of the first source/drain structures; a second read word line and a second programming word line, extending over and intersected with the active area, and spaced apart from each other, wherein a second unit cell of the anti-fuse OTP memory array is defined in a region in which the second read word line and the second programming word line are intersected with the active area; a pair of second source/drain structures, disposed in the active area and within the second unit cell, wherein the second read word line is located between the pair of second source/drain structures, and the first programming word line overlaps one of the second source/drain structures; and a dummy word line, extending over the active area and in between the first and second unit cells, wherein an isolation transistor is defined in a region where the dummy word line is intersected with the active area.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. An anti-fuse one-time programmable (OTP) memory array, comprising:
   unit cells, arranged along columns and rows, and each comprising an access transistor and an anti-fuse storage element electrically coupled to a source/drain terminal of the access transistor; and
   isolation transistors, each electrically coupled to adjacent ones of the unit cells in the same row, and configured to be kept in an off state, to electrically isolate the adjacent ones of the unit cells from each other
   wherein a source/drain terminal of the access transistor in a first one of the unit cells and a source/drain terminal of the access transistor in a second one of the unit cells are functioned as source/drain terminals of one of the isolation transistors coupled between the first and second ones of the unit cells.

2. The anti-fuse OTP memory array according to claim 1, wherein the isolation transistors are N-type field effect transistors.

3. The anti-fuse OTP memory array according to claim 2, wherein gate terminals of the isolation transistors are configured to receive a negative voltage.

4. The anti-fuse OTP memory array according to claim 1, wherein the anti-fuse storage elements are two-terminal devices.

5. The anti-fuse OTP memory array according to claim 4, wherein the anti-fuse storage elements are capacitors.

6. An anti-fuse one-time programmable (OTP) memory array, comprising:
   an active area, laterally extending in a semiconductor substrate;
   a first read word line and a first programming word line, extending over and intersected with the active area, and spaced apart from each other, wherein a first unit cell of the anti-fuse OTP memory array is defined in a region in which the first read word line and the first programming word line are intersected with the active area;

a pair of first source/drain structures, disposed in the active area and within the first unit cell, wherein the first read word line is located between the pair of first source/drain structures, and the first programming word line overlaps one of the first source/drain structures;

a second read word line and a second programming word line, extending over and intersected with the active area, and spaced apart from each other, wherein a second unit cell of the anti-fuse OTP memory array is defined in a region in which the second read word line and the second programming word line are intersected with the active area;

a pair of second source/drain structures, disposed in the active area and within the second unit cell, wherein the second read word line is located between the pair of second source/drain structures, and the first programming word line overlaps one of the second source/drain structures; and a dummy word line, extending over the active area and in between the first and second unit cells, wherein an isolation transistor is defined in a region where the dummy word line is intersected with the active area;

wherein one of the first source/drain structures and one of the second source/drain structures are functioned as source/drain terminals of the isolation transistor.

7. The anti-fuse OTP memory array according to claim 6, wherein the active area continuously extends through the first unit cell, the second unit cell and the isolation transistor between the first and second unit cells.

8. The anti-fuse OTP memory array according to claim 6, further comprising:
    gate spacers, laterally surrounding the first read word line, the second read word line and the dummy word line, respectively.

9. The anti-fuse OTP memory array according to claim 6, further comprising:
    gate dielectric layers, separating the first read word line, the second read word line and the dummy word line from the semiconductor substrate, respectively; and
    capacitor dielectric layers, separating the first and second programming word lines from the semiconductor substrate, respectively.

10. The anti-fuse OTP memory array according to claim 6, wherein the first and second read word lines as well as the dummy word lines are formed of a first conductive material, which is different from a second conductive material for forming the first and second programming word lines.

11. The anti-fuse OTP memory array according to claim 10, wherein the first conductive material comprises polysilicon, and the second conductive material comprises a metal.

* * * * *